(12) United States Patent
Bernardoni et al.

(10) Patent No.: US 11,405,032 B2
(45) Date of Patent: Aug. 2, 2022

(54) SMART ELECTRONIC SWITCH

(71) Applicant: Infineon Technologies AG, Neubiberg (DE)

(72) Inventors: Mirko Bernardoni, Villach (AT); Robert Illing, Finkenstein (AT)

(73) Assignee: Infineon Technologies AG, Neubiberg (DE)

( * ) Notice: Subject to any disclaimer, the term of this patent is extended or adjusted under 35 U.S.C. 154(b) by 48 days.

(21) Appl. No.: 16/924,095

(22) Filed: Jul. 8, 2020

(65) Prior Publication Data

US 2021/0050848 A1 Feb. 18, 2021

(30) Foreign Application Priority Data

Aug. 13, 2019 (DE) .......................... 102019121795.4

(51) Int. Cl.
*H03K 17/082* (2006.01)
*H02H 3/08* (2006.01)

(52) U.S. Cl.
CPC .............. *H03K 17/082* (2013.01); *H02H 3/08* (2013.01); *H03K 2217/0027* (2013.01)

(58) Field of Classification Search
CPC ......... H03K 17/082; H03K 2217/0027; H02H 3/08; H02H 3/28; H02H 9/08; H02H 9/02; H02H 3/20; G01R 31/02; G01R 31/327

(Continued)

(56) References Cited

U.S. PATENT DOCUMENTS 6,144,085 A 11/2000 Barker
6,166,502 A * 12/2000 Pattok ..................... H02P 29/02
318/430

(Continued)

FOREIGN PATENT DOCUMENTS

DE 102004063946 A1 3/2006
DE 102016100498 A1 7/2016

(Continued)

OTHER PUBLICATIONS

Oppenheim et al., Chapter 6, Section 6.3 Basic Structures for IIR Systems, Discrete-Time Signal Processing, 2nd Edition, 1999, pp. 359-361. (Applicant points out, in accordance with MPEP 609. 94(a), that the year of publication, 1999, is sufficiently earlier than the effective U.S. filing date, so that the particular month of publication is not in issue.).

(Continued)

*Primary Examiner* — Danny Nguyen
(74) *Attorney, Agent, or Firm* — Shumaker & Sieffert, P.A.

(57) ABSTRACT

An integrated circuit that may be employed as a smart switch is described herein. In accordance with one embodiment the integrated circuit includes a power transistor coupled between a supply pin and an output pin and a current sensing circuit coupled to the power transistor and configured to generate a current sense signal indicative of a load current passing through the power transistor. The integrated circuit further comprises a monitor circuit configured to receive the current sense signal and to provide a protection signal based on the current sense signal and a threshold value, wherein the monitor circuit includes a filter that is configured to receive a filter input signal that depends on the current sense signal. The filter has a transfer characteristic with two or more time constants.

21 Claims, 6 Drawing Sheets

(58) Field of Classification Search
USPC .................................. 361/86–87, 93.7–93.9
See application file for complete search history.

(56) References Cited

U.S. PATENT DOCUMENTS

| | | | |
|---|---|---|---|
| 7,279,765 | B2 | 10/2007 | Ahn et al. |
| 7,489,855 | B2 | 2/2009 | Kraus |
| 9,413,352 | B2 | 8/2016 | Lim |
| 9,672,201 | B1 | 6/2017 | Uszkoreit et al. |
| 9,887,532 | B2 | 2/2018 | Djelassi et al. |
| 9,954,548 | B2 | 4/2018 | Illing et al. |
| 10,305,363 | B1 | 5/2019 | Chen et al. |
| 10,868,418 | B2 | 12/2020 | Djelassi-Tscheck et al. |
| 2002/0024376 | A1 | 2/2002 | Sander |
| 2003/0001533 | A1* | 1/2003 | Kleinau ............... B62D 5/0469 318/434 |
| 2005/0184715 | A1 | 8/2005 | Kidokoro et al. |
| 2005/0270869 | A1 | 12/2005 | Krischke et al. |
| 2007/0008744 | A1 | 1/2007 | Heo et al. |
| 2012/0194119 | A1 | 8/2012 | Kroeze et al. |
| 2013/0082627 | A1* | 4/2013 | Ichikawa ................. H02P 6/00 318/139 |
| 2013/0301175 | A1 | 11/2013 | Posat |
| 2014/0078629 | A1 | 3/2014 | Cortigiani et al. |
| 2014/0091384 | A1 | 4/2014 | Petruzzi et al. |
| 2015/0285843 | A1* | 10/2015 | Michal ............... H02M 3/1588 324/713 |
| 2017/0063077 | A1 | 3/2017 | Donath et al. |
| 2017/0294772 | A1 | 10/2017 | Illing et al. |
| 2017/0294918 | A1 | 10/2017 | Illing et al. |
| 2017/0294922 | A1 | 10/2017 | Illing et al. |
| 2017/0366116 | A1 | 12/2017 | Ogawa et al. |
| 2018/0287365 | A1 | 10/2018 | Djelassi-Tscheck et al. |
| 2020/0021207 | A1 | 1/2020 | Donat et al. |

FOREIGN PATENT DOCUMENTS

| | | |
|---|---|---|
| DE | 102015144460 A1 | 3/2017 |
| DE | 102017107520 A1 | 11/2017 |
| DE | 102017107523 A1 | 11/2017 |
| DE | 102017106896 A1 | 10/2018 |
| WO | 01/69784 A1 | 9/2001 |

OTHER PUBLICATIONS

Infineon Technologies AG, "BTN8962TA High Current PN Half Bridge NovalithIC™," Data Sheet, Rev 1.0, May 17, 2013, 26 pp.
International Standard ISO 7637-2, Third Edition, Mar. 1, 2011, entitled "Road vehicles—Electrical disturbances from conduction and coupling—Part 2: Electrical transient conduction along supply lines only," 48 pp.
International Standard ISO 26262-1, Second Edition, Dec. 2018, entitled "Road vehicles-Functional safety—Part 1: Vocabulary," 42 pp.
Office Action, in the German language, from counterpart German Application No. DE 10 2019 121 795.4, dated May 6, 2020, 9 pp.
Office Action, in the German language, from counterpart German Application No. 102019121795.4, dated Nov. 29, 2020, 6 pp.
Jain et al., "Analysis and Design of Digital IIR Integrators and Differentiators Using Minimax and Pole, Zero, and Constant Optimization Methods," accepted May 2013, 15 pp.
Oppeheim et al., "Discrete-Time Signal Processing," Sec. 6.3, Second Edition, ISBN 0-13-754920.2, 1999, 5 pp. (Applicant points out, in accordance with MPEP 609.04(a), that the year of publication, 1999, is sufficiently earlier than the effective U.S. filing date, so that the particular month of publication is not in issue.).

* cited by examiner

SMART ELECTRONIC SWITCH

This application claims priority to German Patent Application Number 102019121795.4, filed Aug. 13, 2019, the entire content of which is incorporated herein by reference.

TECHNICAL FIELD

The present disclosure relates to the field of smart semiconductor switches.

BACKGROUND

Almost every electric installation (e.g. in an automobile, in a house, electric subsystems of larger installations) includes one or more fuses to provide an over-current protection. Standard fuses include a piece of wire that provides a low-ohmic current path in case the current passing through the fuse is below a nominal current. However, the piece of wire is designed to heat up and melt or vaporize when the current passing through the fuse exceeds the nominal current for a specific time. Once triggered, a fuse must be replaced by a new one.

Fuses are being increasingly replaced by circuit breakers. A circuit breaker is an automatically operated electrical switch designed to protect an electrical circuit from damage caused by overcurrent, overload or short-circuit. Circuit breakers may include electro-mechanical relays, which are triggered to disconnect the protected circuit from the supply when an over-current (i.e. a current exceeding the nominal current) is detected. In many applications (e.g. in the on-board power supply of an automobile), circuit breakers may be implemented using an electronic switch (e.g. a MOS transistor, an IGBT or the like) to disconnect the protected circuit from the supply in case of an over-current. Such electronic circuit breakers may also be referred to as electronic fuses (e-fuses or smart fuses). Besides its function as a circuit breaker, an electronic fuse may also be used to regularly switch a load on and off. Usually the switching state (on/off) of electronic switches such as MOS transistors is controlled using so-called driver circuits or simply drivers (gate drivers in case of MOS transistors).

Usually, conventional fuses—and also electronic fuses—are designed for a (hypothetical) constant electric load that results in a specific thermal load of the cable. That is, the constant electric load results in a specific cable temperature above ambient temperature. The purpose of the fuse is to ensure that the thermal load of the cable stays within a defined limit. Therefore, known electronic fuse circuits are designed to emulate the time-current characteristic (which defines for how long a specific current level may flow through the electronic fuse before the fuse triggers the disconnection of the load) of a conventional fuse. However, in many applications the load changes dynamically. In view of the fact that the thermal time constant of commonly used cables is in the range of a few minutes (e.g. 90 seconds in some applications) the activation of an electric load for, e.g., 30 seconds, may be a highly dynamic process as compared to the thermal time constant of the cable.

SUMMARY

An integrated circuit that may be employed as a smart switch is described herein. In accordance with one embodiment the integrated circuit includes a power transistor coupled between a supply pin and an output pin and a current sensing circuit coupled to the power transistor and configured to generate a current sense signal indicative of a load current passing through the power transistor. The integrated circuit further comprises a monitor circuit configured to receive the current sense signal and to provide a protection signal based on the current sense signal and a threshold value, wherein the monitor circuit includes a filter that is configured to receive a filter input signal that depends on the current sense signal. The filter has a transfer characteristic with two or more time constants.

Furthermore, a method that may be used to operate a smart electronic switch as electronic fuse is described herein. In accordance with one embodiment the method includes enabling a load current path from a supply pin and an output pin by switching-on a power transistor, providing a signal representing the load current passing through the power transistor, and generating a protection signal based on the current sense signal and a threshold value. The generation of the protection signal includes the filtering of a filter input signal that is dependent on the load current signal using a filter that has a transfer characteristic with two or more time constants.

BRIEF DESCRIPTION OF THE DRAWINGS

The embodiments described below can be better understood with reference to the following drawings and descriptions. The components in the figures are not necessarily to scale; instead emphasis is placed upon illustrating the principles of the invention. Moreover, in the figures, like reference numerals designate corresponding parts. In the drawings:

FIGS. 10A-10D are graphs illustrating a method for determining the time constants and gains to be used in the filter included in the monitoring circuit of FIG. 9.

DETAILED DESCRIPTION

In the following detailed description, reference is made to the accompanying drawings. The drawings form a part of the description and, for the purpose of illustration, show examples of how the invention may be used and implemented. It is to be understood that the features of the various embodiments described herein may be combined with each other, unless specifically noted otherwise.

Figure 1:
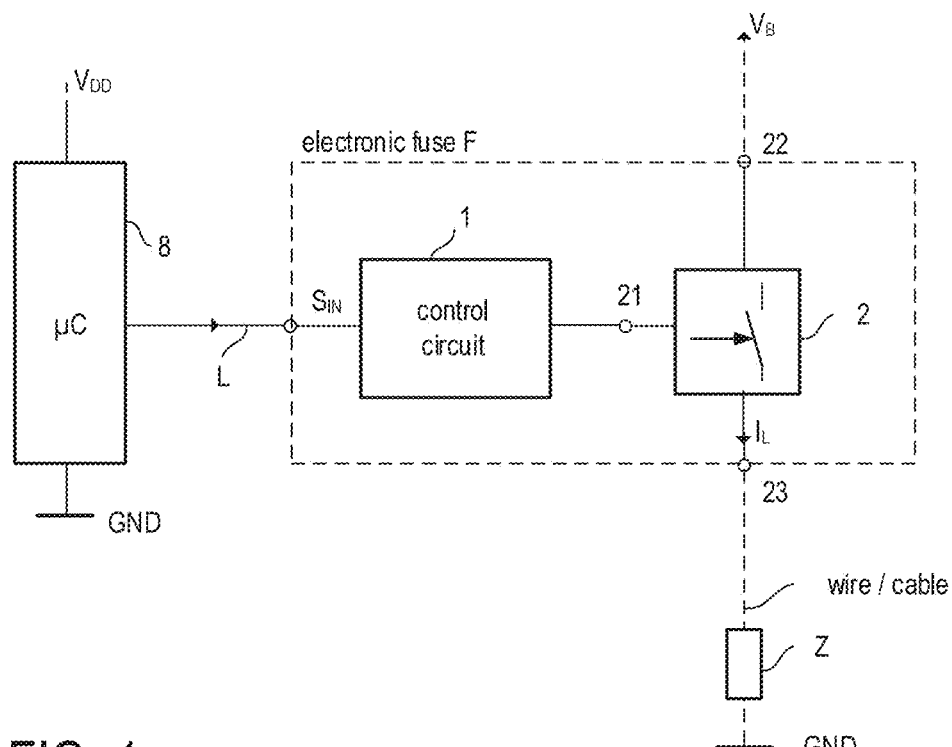
FIG. 1 schematically illustrates one example of an electronic fuse circuit including an electronic switch and a control circuit configured to drive the electronic switch and an exemplary application of the electronic fuse circuit.

FIG. 1 illustrates one example of an electronic circuit that may be operated as an electronic fuse. Therefore, the electronic circuit is further referred to as electronic fuse circuit F. In accordance with the present example, an electronic fuse circuit includes an electronic switch 2 with a control node 21 and a load current path between a first load node 22 and a second load node 23. The electronic circuit further includes a control circuit 1 coupled to the control node 21 of the electronic switch 2 and configured to drive the electronic switch 2. The electronic fuse circuit F with electronic switch 2 and control circuit 1 may be monolithically integrated in one semiconductor die (chip) or may be integrated in two semiconductor dies that are arranged in one integrated circuit package. The electronic fuse circuit F is configured to drive a load Z (the wires connecting the load are illustrated in dashed lines in FIG. 1), which can be connected in series with the load current path of the electronic switch 2. Thus, the series circuit of the load current path of the electronic switch 2 and load Z may be connected between supply nodes, at which a positive supply potential and a negative supply potential or ground potential GND (zero volts) may be provided. In the following, a voltage between the two supply nodes is referred to as supply voltage $V_B$. The load current $i_L$ passing through the load Z may be switched on and off in accordance with an input signal $S_{IN}$ supplied to the control circuit 1, for example, by a micro controller 8. However, dependent on the application, the input signal $S_{IN}$ may be generated by any other circuitry instead of a micro controller.

In an exemplary application, the electronic fuse circuit F may be used to drive a load Z in an automobile. In this case, the power source that supplies the supply voltage $V_B$ is an automobile battery. Generally, "to drive a load" may include switching on or off the load current passing through the load by switching on or off the electronic switch 2. The load may be an arbitrary load used in an automobile. Examples of the load Z include, inter alia, different types of lamps, different types of motors, relays, a heating system, or the like. In the example illustrated in FIG. 1, the electronic switch 2 and the load Z are connected in a high-side configuration. That is, the load Z is connected between the electronic switch 2 and the ground node GND. This, however, is only an example. The electronic switch 2 and the load Z may also be connected in a low-side configuration or in any other configuration as well. For example, in a low-side configuration the electronic switch is connected between the load Z and the ground node GND.

According to the example of FIG. 1, the load Z may be connected to the electronic switch 2 via an electrically conductive wire (e.g. included in a cable). Dependent on where the electronic circuit and the respective load Z are located in the electric installation of an automobile, the wire may have a considerable length of several 10 cm or even more (e.g. up to 10 m). A modern automobile includes a plurality of electric loads, so that a plurality of wires are required to connect the individual loads to their respective electronic switches. In order to save costs and resources, it may be desirable to dimension the individual wires such that, in the long term, they withstand a nominal current of the connected load. If, however, the current rises above the nominal current, the wire may be damaged or even destroyed due to overheating. According to one exemplary embodiment, the control circuit 1 may therefore have a current monitor function in order to monitor the load current $i_L$ passing through the electronic switch 2 (and the load Z). The current monitoring allows to switch off the electronic switch 2 in order to protect the wire (and the load Z) when an overload scenario is detected. An "overload scenario" is a scenario that may result in the wire or the load being damaged or destroyed if the electronic switch 2 is not switched off (within a specific time) to disconnect the wire (and the load Z) from the power source that provides the supply voltage $V_B$ (e.g. the automobile battery). This mechanism is explained in further detail herein below. As the electronic fuse circuit F is configured to switch on and off the load Z and to protect the wire, it is also referred to as switching and protection circuit in the following.

In the example of FIG. 1, the electronic switch 2 is schematically drawn as a circuit block that includes a switch. In the following, the term "electronic switch" includes any type of electronic switch or electronic circuitry that has a control node 21 and a load current path between the first load node 22 and the second load node 23 and that is configured to be switched on and off dependent on a drive signal received at the control node 21. "Switched on" means that the electronic switch 2 operates in an on-state in which the electronic switch 2 is capable of conducting a current between the first load node 22 and the second load node 23. "Switched off" means that the electronic switch 2 is operated in an off-state in which the electronic switch 2 is capable of preventing a current flow between the first load node 22 and the second load node 23. According to one example, the electronic switch 2 includes at least one transistor. The at least one transistor may be, for example, a MOSFET (Metal Oxide Semiconductor Field-Effect Transistor), an IGBT (Insulated Gate Bipolar Transistor), a JFET (Junction Field-Effect Transistor), a BJT (Bipolar Junction Transistor), or a HEMT (High Electron Mobility Transistor).

In the following, examples of the control circuit 1 and its function are explained with reference to drawings. In particular, the function of the control circuit 1 is explained with reference to functional blocks depicted in the drawings. It should be noted that these functional blocks represent the function of the control circuit 1 rather than its specific implementation. These functional blocks may be dedicated circuit blocks configured to perform the respective function explained below. However, it may also be possible for the functions of the individual functional blocks to be performed by a programmable circuit (processor) that is configured to execute software/firmware stored in a memory.

Figure 2:
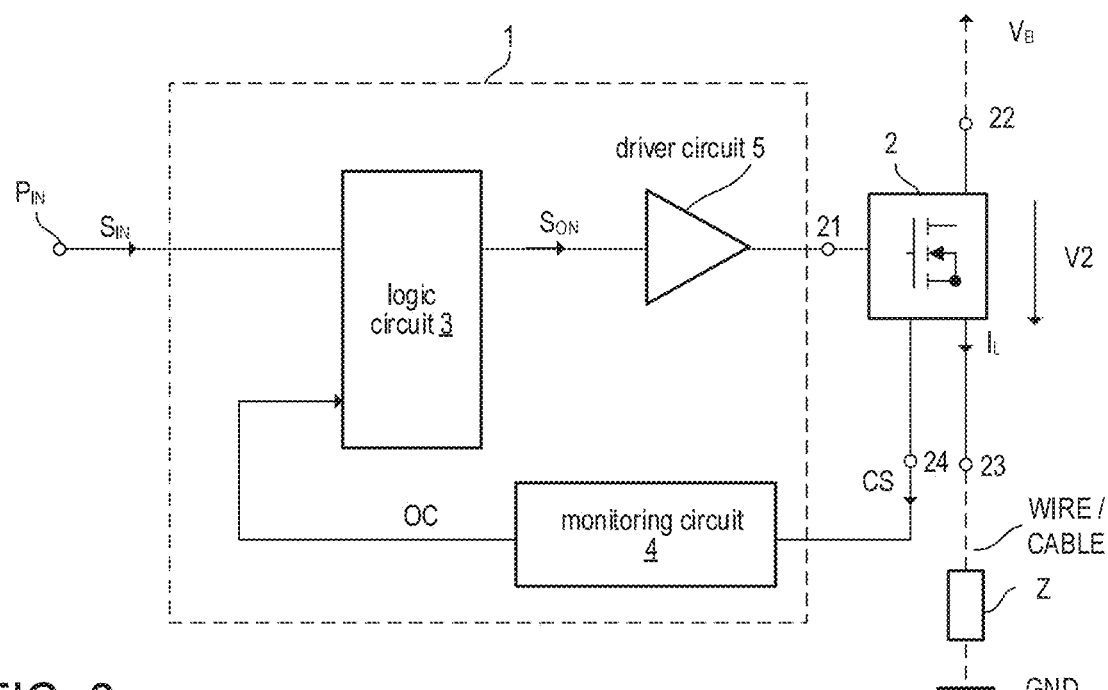
FIG. 2 illustrates one example of the control circuit of FIG. 1 in more detail.

FIG. 2 illustrates one exemplary implementation of the control circuit 1. In this example, the control circuit 1 includes a monitoring circuit 4 that is configured to generate a first protection signal OC based on a current-time-characteristic of the load current $i_L$. The expression "to generate the first protection signal OC based on the current-time-characteristic of the load current $i_L$" may include that the monitoring circuit 4 processes an instantaneous current amplitude of the load current $i_L$ as well as previous current amplitudes to generate the first protection signal OC. That is, the monitoring circuit 4 evaluates the load current $i_L$ over a certain time period in order to generate the first protection signal OC. In order to be able to evaluate the load current $i_L$ the monitoring circuit 4 receives a current sense signal CS and generates the first protection signal OC based on the current sense signal CS. The current sense signal CS represents the load current $i_L$ and, according to one example, may be proportional to the load current $i_L$. In the example of FIG. 2, the current sense signal CS is available at a sense output 24 of the electronic switch 2. In this case, a current measurement circuit configured to measure the load current $i_L$ and provide the current sense signal CS may be (at least partially) integrated in the electronic switch 2. However, this is only an example. A current measurement circuit separate from the electronic switch 2 may be used as well. Various current sense circuits (e.g. shunt resistors, Sense-FET circuits, etc.) are known and are thus not further explained herein in detail.

The control circuit 1 illustrated in FIG. 2 is configured to drive the electronic switch 2 based on the protection signal OC and an input signal $S_{IN}$ received at a first input node (e.g. input pin) $P_{IN}$ of the electronic fuse circuit F. The protection signal OC, as well as the input signal $S_{IN}$, are supplied to a logic circuit 3, which generates a drive signal $S_{ON}$ based on the protection signal OC and the input signal $S_{IN}$. The drive signal $S_{ON}$ is directly or indirectly (e.g. via diver circuit 5) supplied to the control node 21 of the electronic switch 2 in order to switch the electronic switch 2 on or off. According to one example, the drive signal $S_{ON}$ may be a logic signal that has an on-level indicating that it is desired to switch the electronic switch 2 on or an off-level indicating that it is desired to switch the electronic switch 2 off. The driver circuit 5 (or simply driver) is configured to drive the electronic switch 2 based on the respective signal level of the drive signal $S_{ON}$. The electronic switch 2, for example, includes a transistor such as a MOSFET (as schematically illustrated in FIG. 2). A MOSFET is a voltage-controlled semiconductor device that switches on or off dependent on a drive voltage applied between a gate node and a source node. In this example, the driver 5 is configured to generate the drive voltage (gate voltage $V_G$) based on the drive signal $S_{ON}$ in order to switch on or off the MOSFET in accordance with the drive signal. When using MOSFETs, the driver 5 is also referred to as gate driver.

Figure 3:
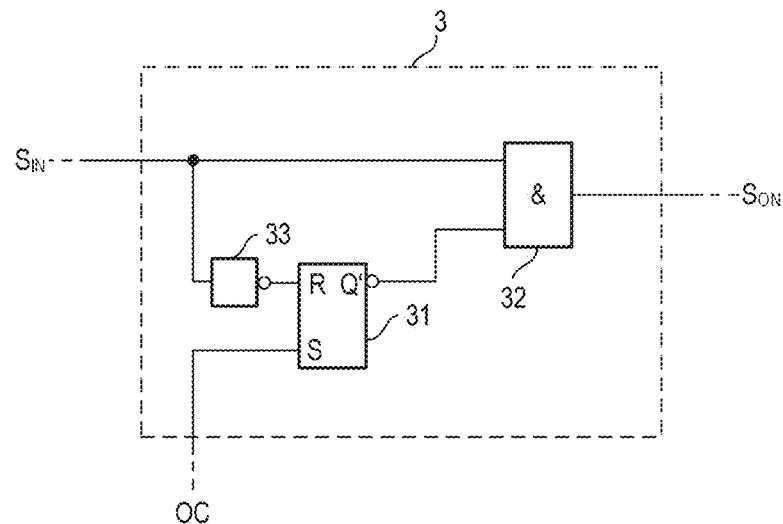
FIG. 3 illustrates one example of a logic circuit used in the control circuit of FIG. 2.

The circuit of FIG. 3 illustrates one exemplary implementation of (a part of) the logic circuit 3. In the present example, the logic circuit 3 includes an inverter 33, an SR latch 31 (flip-flop) and an AND gate 32. A first input of the AND gate 32 is configured to receive the input signal $S_{IN}$, whereas a reset input R of the SR latch 31 is configured to receive the inverted input signal provided by inverter 33. The set input S of the SR latch 31 is configured to receive the protection signal OC. The inverting output Q' of the SR latch 31 is connected with a second input of the AND gate 32. The drive signal $S_{ON}$ is provided at the output of the AND gate 32.

Figure 4:
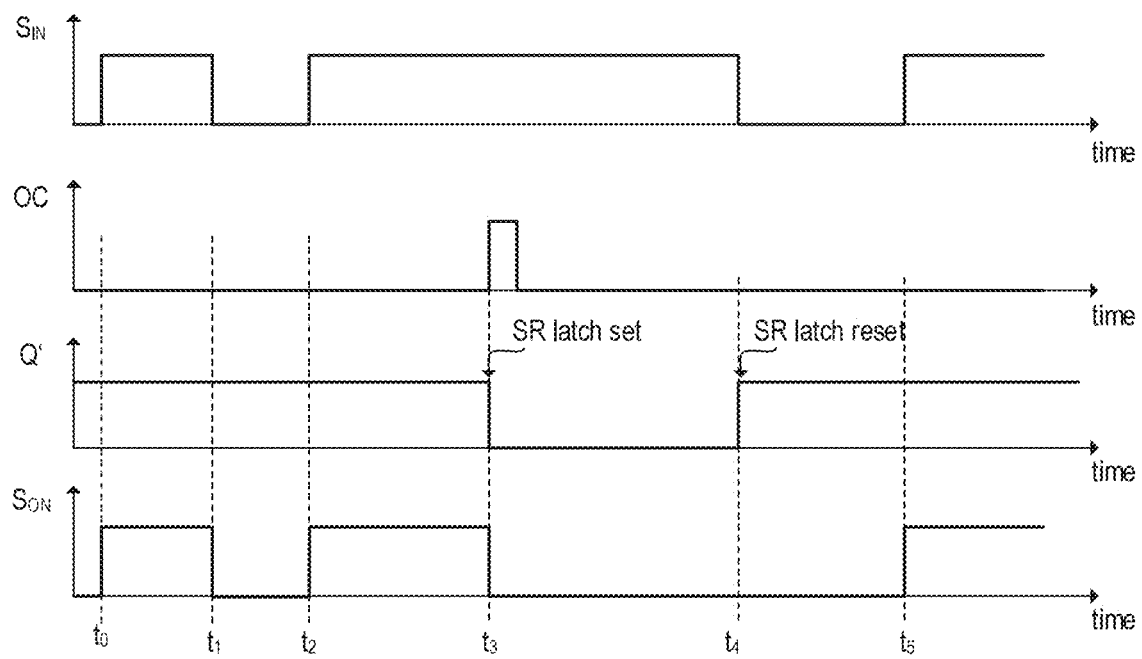
FIG. 4 shows timing diagrams illustrating the function of the control circuit shown in FIG. 2.

The function of the logic circuit 3 is further illustrated by the timing diagrams of FIG. 4. The initial low level of input signal $S_{IN}$ causes a reset of the SR latch 31, which results in a high level at the inverting output Q' of the SR latch 31. Accordingly, both inputs of the AND gate 32 "see" a high level, and thus the output of the AND gate 32 provides the drive signal $S_{ON}$ with a high-level. When the input signal $S_{IN}$ changes to a low level (indicating a switch-off of the electronic switch 2, see FIG. 4, time instant $t_1$ and $t_2$), the AND gate 32 "sees" a low level at its first input, and thus the output of the AND gate 32 provides the drive signal $S_{ON}$ with a low-level (which causes a switch off of the power transistor 2). In other words, the input signal $S_{IN}$ is fed through the logic circuit 3 (i.e. the drive signal $S_{ON}$ equals the input signal $S_{IN}$) provided that the SR latch 31 is in its reset state. Once the SR latch 31 is set in response to the protection signal OC changing to a high-level, the inverting output Q' of the SR latch 31 is set to a low level (see FIG. 4, time instant $t_3$). Accordingly, the AND gate 32 sees a low level at its second input and thus the drive signal $S_{ON}$ is set to a low level. In other words, the input signal $S_{IN}$ is blanked by the AND gate 32. The drive signal $S_{ON}$ remains at a low-level until the input signal $S_{IN}$ is set to a low level (indicating a switch-off of the electronic switch 2 and a reset of SR latch 31, see FIG. 4, time instant $t_4$) and again to a high level (indicating a switch-on of the electronic switch 2, see FIG. 4, time instant $t_5$). It is again noted that the function of the exemplary implementation of FIG. 3 may be implemented in various other ways as well.

Figure 5A:
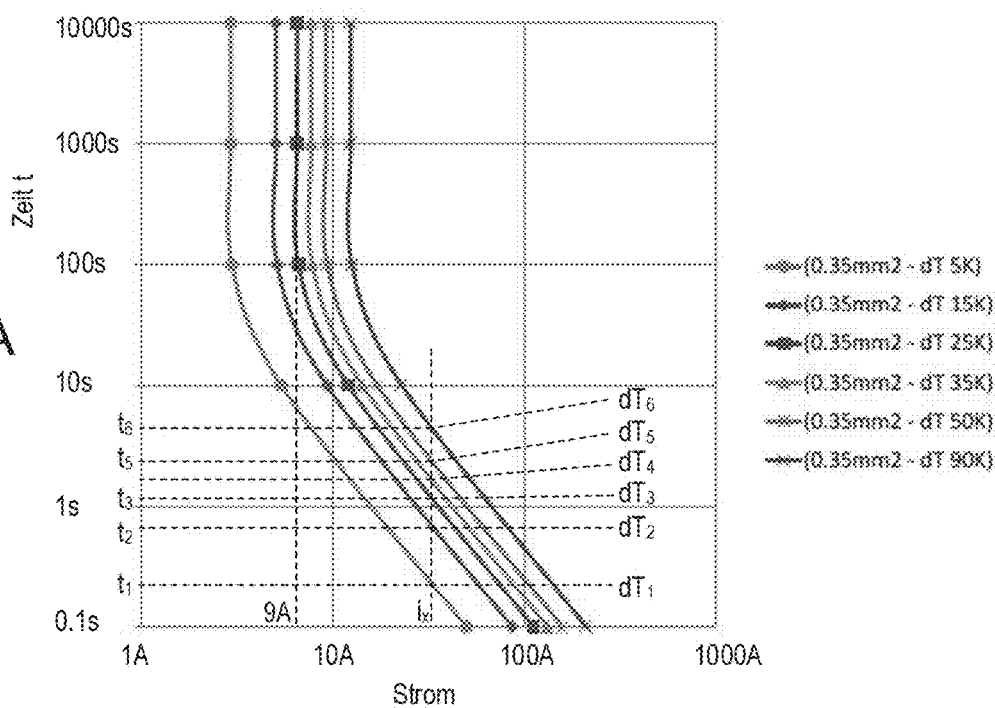
FIG. 5a is a diagram illustrating a family of characteristic curves (time over current) for a 0.35 mm$^2$ cable and for different maximum cable temperatures.
Figure 5B:
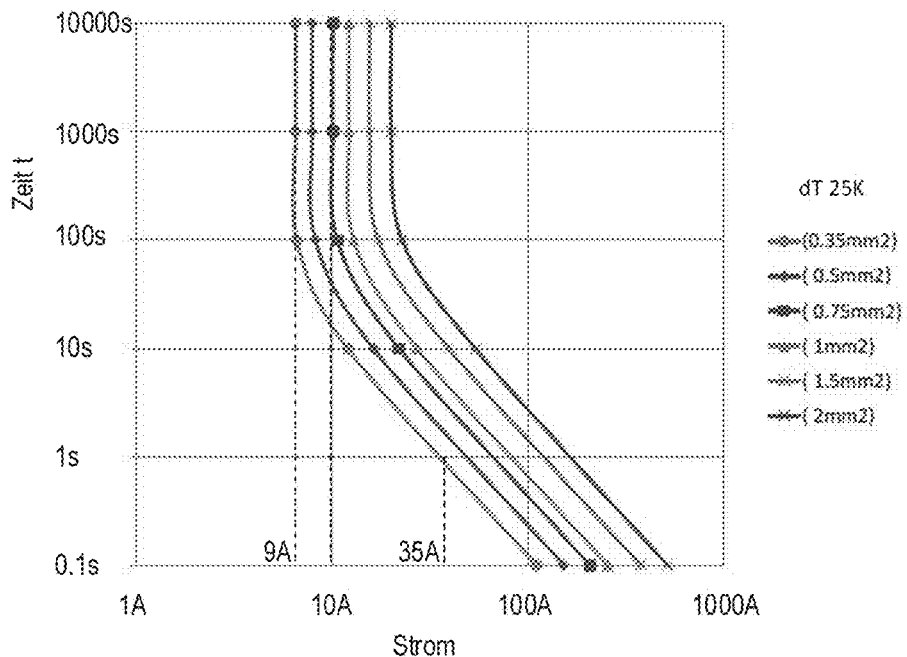
FIG. 5b is a diagram illustrating a family of characteristic curves (time over current) for a maximum cable temperature of 25 Kelvin above ambient temperature and for different cable cross-sections.

As mentioned above, the wire connecting load Z and electronic fuse circuit F may be designed to withstand a nominal current of the load Z. The lifetime of a wire (or a cable) depends on the wire temperature. FIGS. 5A and 5B are diagrams showing a family of characteristic curves, wherein each characteristic curve is associated with a specific combination of maximum temperature difference dT (maximum temperature above ambient temperature) and cable cross section (e.g. cross-sectional area in mm²). Each characteristic curve can be regarded as an "isotherm" (line of equal temperature dT) and represents the relation between current and the maximum allowable time period that the wire can carry the current without exceeding the specified temperature difference dT. FIG. 5A shows characteristic curves for various temperature differences dT and a specific cross-sectional area of 0.35 mm², while FIG. 5B shows characteristic curves for a specific temperature difference dT of 25 K (Kelvin) and various cross-sectional areas. As can be seen from FIGS. 5A and 5B, a wire with a cross-sectional area of 0.35 mm² may carry a current of approximately 9 A (amperes) for a practically infinite amount of time without exceeding a temperature difference dT of 25 K above ambient temperature. As can be seen from FIG. 5B, a wire with a cross-sectional area of 0.75 mm² may carry a current of 10 A (amperes) for approximately 100 seconds or 35 A for approximately 1 second before exceeding a temperature difference dT of 25 K above ambient temperature. Generally, the higher the current, the shorter the allowable time period for a given cross-sectional area and a given temperature difference. It is noted that the characteristic curves shown in the diagrams of FIGS. 5A and 5B have a linearly falling branch in a double logarithmic representation.

As can be seen from FIGS. 5A and 5B, a temperature difference $dT_x$ (e.g. temperature values $dT_1$, $dT_2$, $dT_3$, $dT_4$, $dT_5$, $dT_6$) is associated with a given integration time $t_x$ (e.g. times $t_1$, $t_2$, $t_3$, $t_4$, $t_5$, $t_6$) for a given current (see FIG. 5A, current $i_x$) and a specific cross-sectional area (e.g. 0.35 mm² in the example of FIG. 5A). Hence, a temperature value dT (representing the temperature above ambient temperature) may be determined for a specific wire cross section by integrating the power resulting from a load current $i_L = i_x$ passing through the wire over time. The first protection signal OC may indicate a switch-off of the electronic switch 2 when the temperature value dT reaches a defined first reference temperature difference $dT_R$. The mentioned integration may be efficiently implemented using a digital filter, which may be included in the monitoring circuit 4 (see FIG. 2). One exemplary implementation of a monitoring circuit is illustrated in FIG. 6.

Figure 6:
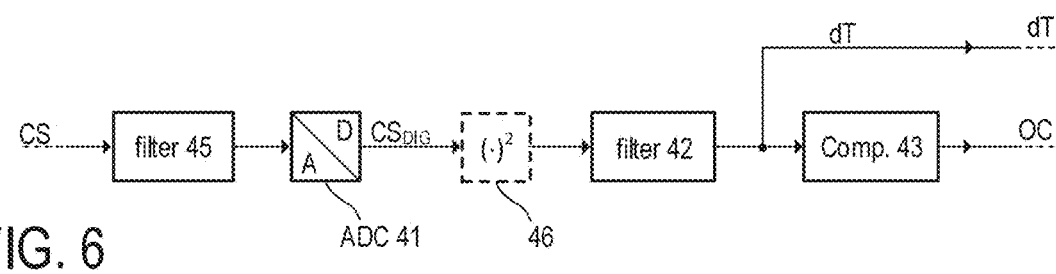
FIG. 6 illustrates one example of the monitoring circuit used in the example of FIG. 2

Basically, the monitoring circuit of FIG. 6 is configured to determine the first protection signal OC based on the current sense signal CS. As mentioned, the integration may be accomplished in digital filter 42, which has an integrating characteristic. According to the depicted example, the current sense signal CS, which may be a voltage that is proportional to the load current $i_L$, is supplied to the input of filter 45, which may be an (optional) analog low-pass filter, to remove transients or the like that have a comparably high frequency. The output of filter 45 may be connected to the input of analog-to-digital converter (ADC) 41, which is configured to digitize the filtered current sense signal CS. The ADC 41 may have a logarithmic characteristic in order to account for the logarithmic characteristic curves shown in FIGS. 5A and 5B. The (e.g. logarithmized) digital current sense signal $CS_{DIG}$ is then "transformed" to a temperature value dT by digital filter 42. The resulting temperature value dT (representing a temperature difference above ambient temperature) is then supplied to digital comparator 43, which may be configured to set the first protection signal OC to a high-level when the temperature value dT provided at the output of digital filter 42 exceeds the first reference temperature difference $dT_R$ (e.g. 25 K) specified for a specific wire cross-section. Accordingly, the squaring unit 46 depicted in FIG. 6 maybe omitted, dependent on the characteristic of the ADC 41. It is understood that the squaring unit 46 may be replaced by other suitable non-linear functions. In essence, the input signal supplied to filter 42 is representative of the power resulting from the load current $i_L$.

As mentioned, the digital filter 42 is configured to convert the (squared, as the case may be) load current (represent by the digitized current sense signal $CS_{DIG}$) and an associated integration time during which the current passes through the wire, into a temperature value dT. In the present example, the filter characteristic 42 depends on a parameter characterizing the wire, e.g. the cross-sectional area of the wire that carries the current, and may be represented by a family of characteristic curves such as those shown in the diagram of FIG. 5A (for an exemplary cross-sectional area of 0.35 mm$^2$). In one specific example, the characteristic curves (or related curves) may be stored as a look-up table, i.e. by storing a plurality of sampling points of the characteristic curves in a memory. Values between two sampling points may be determined using, e.g. interpolation.

Figure 7:
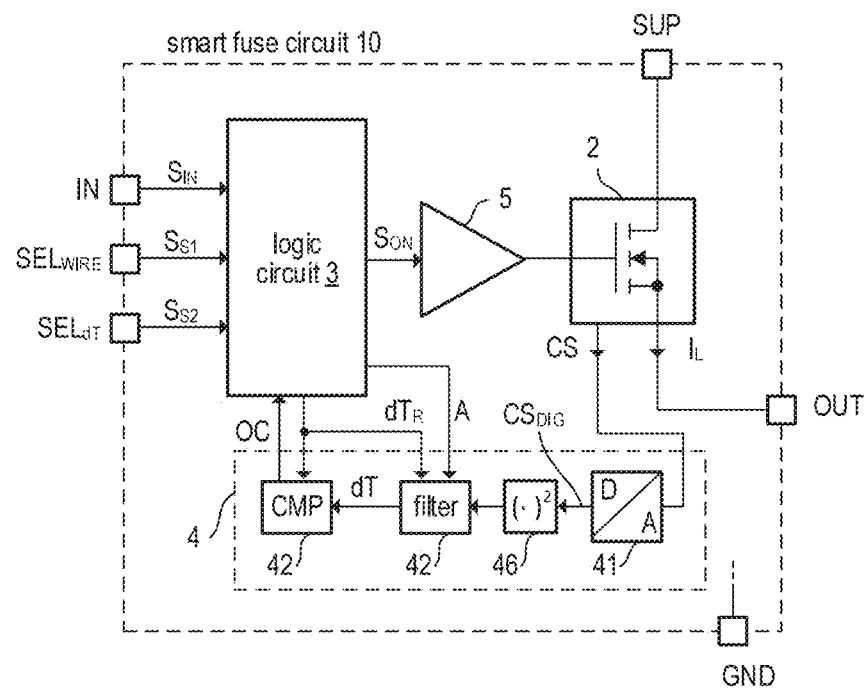
FIG. 7 illustrates a first example of an e-fuse ("smart fuse") circuit that allows selection of wire cross section and maximum cable temperature.

FIG. 7 illustrates one example of an electronic fuse circuit, which is further referred to as smart fuse circuit 10. The circuit of FIG. 7 is substantially the same as the circuit of FIG. 2 and reference is made to the respective description. However, the logic circuit 3 is more sophisticated than in the example of FIG. 2 and the monitoring circuit 4 is implemented in accordance with FIG. 6, wherein the analog low-pass filter 45 has been omitted (the low-pass filter 45 is optional). However, different from the example in FIG. 6, the monitoring circuit 4 is configurable in the present example so that its characteristic can be selected based on at least one wire parameter, which allows, for example, to select a characteristic for a specific wire cross section and/or a desired reference temperature difference $dT_R$. In the examples described herein, the at least one wire parameter is or represents the cable cross-sectional area and/or the maximum temperature value above ambient temperate. As can be seen in the diagrams of FIGS. 5A and 5B, these two wire parameters define a specific characteristic curve that represents the desired behavior of the electronic fuse circuit for a specific wire/cable. It is understood that other parameters such as wire diameter or absolute temperature (e.g. in case ambient temperature is measured) may be used as wire parameters. Furthermore, a wire parameter is not necessarily representative of any physical quantity (such as cross-sectional area or temperature) but can be a mere numerical parameter that allows determining (e.g. selecting) the desired characteristic used by the monitoring circuit. As shown in FIG. 7, the electronic fuse circuit may be an integrated circuit arranged in one chip package, wherein the electronic switch 2 and the remaining circuit components (driver 5, logic circuit 3 and monitoring circuit 4) may be integrated in the same semiconductor die or in two separate semiconductor dies disposed in the chip package. However, in other embodiments the smart fuse circuit 10 may be distributed in two or more separate chip packages. In the example of FIG. 7 all the depicted circuit components are integrated in one semiconductor chip.

The load current path of the electronic switch 2 may be connected between a supply pin SUP and an output pin OUT of the smart fuse circuit 10. Generally, the logic circuit 3 may be configured to receive at least one wire parameter, which in the present example includes information about a wire cross-sectional area A and a reference temperature difference $dT_R$, from a microcontroller or other control circuitry. As illustrated in FIG. 6, the logic circuit 3 may be configured to receive signals from a controller via input pin IN (input signal $S_{IN}$, see also FIG. 2) and input pins $SEL_{WIRE}$ and $SEL_{dT}$ (selection signals $S_{S1}$ and $S_{S2}$ representing a wire cross-sectional area and a temperature difference) and to provide a drive signal $S_{ON}$ for the electronic switch 2. The driver 5 may be configured to convert the signal $S_{ON}$, which is a binary logic signal, into a drive voltage or drive current suitable to switch the electronic switch 2 on and off. As in the example of FIG. 2, the monitoring circuit 4 receives an (analog) current sense signal CS and generates, based on this current sense signal CS, the first protection signal OC, which may be processed by the logic circuit 3, for example, as shown in the example of FIG. 3.

Based on the information included in the at least one wire parameter and received, e.g., from the controller 8 (cf. FIG. 8), the control logic 3 may configure the digital filter 42 and/or the comparator 43 so that the characteristic of the monitoring circuit 4 corresponds to a specific combination of wire cross-sectional area A and reference temperature difference $dT_R$. In the present example, the monitoring circuit 4 can be configured based on the selection signals $S_{S1}$ and $S_{S2}$ received at the input pins input pins $SEL_{WIRE}$ and $SEL_{dT}$. Thus, the selection signal $S_{S1}$ may represent, as a first wire parameter, a reference temperature difference $dT_R$ (which may be used as a temperature threshold in the comparator 43) and the selection signal $S_{S2}$ may represent, as a second wire parameter, a cross-sectional area A of the wire. The ground pin GND shown in FIG. 7 is coupled to a reference potential, e.g. ground potential, and connected to the logic circuit 3, and other circuit components that need a reference potential for proper operation. It is noted that a single (analog) input pin may be sufficient to select a wire with a desired cross-section and temperature difference. Furthermore, it is understood that, in another embodiment, the first and the second wire parameter may also be coded into a single (e.g. digital) selection signal. It is understood that the specific mechanism of how the information concerning the characteristics used by monitoring circuit is provided to the logic circuit 3 is not relevant. Basically, the monitor circuit 4 is configured to be suitable for a specific wire.

As mentioned above, the characteristic curves illustrated in FIGS. 5$a$ and 5$b$ can be regarded as isotherms. Accordingly, each point on a specific isotherm (associated with a specific temperature difference over ambient temperature) represents a specific combination of current and time. In other words, the isotherm defines, for each current, a time span during which the current needs to pass through the cable to reach the temperature (over ambient temperature) associated with the isotherm. A conventional fuse is selected such that it blows before the cable has reached a given maximum temperature difference, i.e. a given thermal load. Known electronic fuse devices imitate this behavior and disconnect the load from the supply when an estimated cable temperature (over ambient temperature) reaches a predetermined reference temperature. To obtain such a behavior the filter 42 in the monitoring circuit of FIG. 6 needs to have a first order (low-pass) characteristic and a filter gain. Such a filter characteristic may be expressed by a transfer function $H(s)=R_1/(1+s\tau_1)$, wherein s denoted the Laplace variable, $R_1$ denotes the filter gain and $\tau_1$ the time constant of the first order filter.

Figure 8:
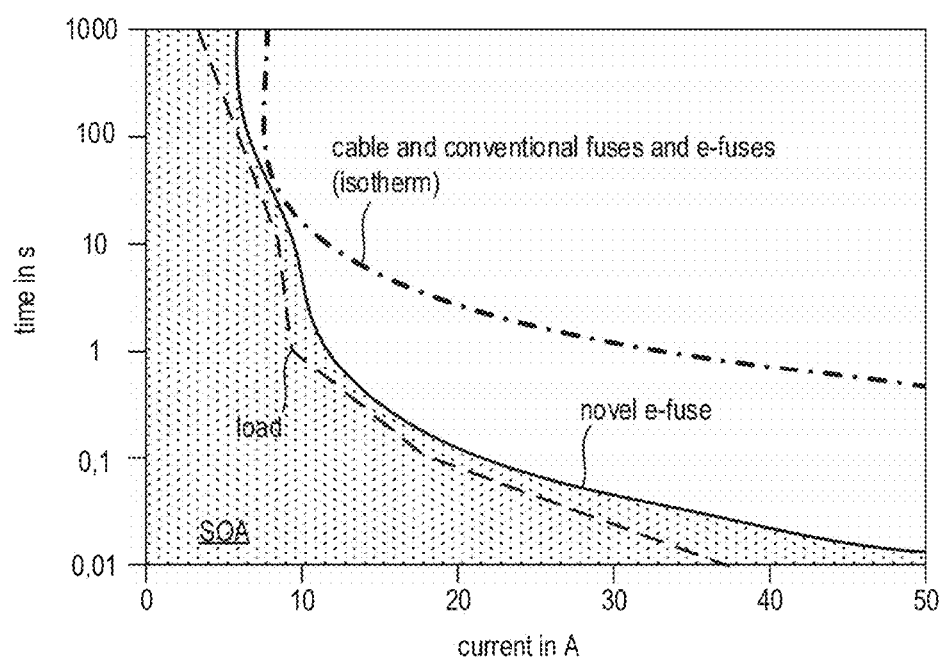
FIG. 8 is a diagram illustrated time-current characteristic curves of a load, a cable and an novel, enhanced electronic fuse.

FIG. 8 shows a diagram illustrating an isotherm of a cable as described above (see FIG. 8, dash-dotted line which is similar to the curves shown in FIGS. 5A and 5B). As mentioned, known e-fuse devices use such a characteristic to disconnect the load from the supply when the load current is so high that the resulting (estimated) temperature of the cable reaches the temperature associated with the isotherm (reference temperature $dT_R$). However, a dynamic load has a time-current characteristic that is significantly different from the time-current characteristic of the isotherm characterizing a cable. One example is illustrated in FIG. 8 (see FIG. 8, dashed line). If the electronic fuse is designed to use the time-current characteristic of the load (instead of the time-current characteristic of the cable) it will be possible to detect when the current behavior of the load deviates from its known time-current characteristic. Such a deviation may be indicative of a malfunction of the load. The solid line in the diagram of FIG. 8 illustrates the desired time-current characteristic of a novel electronic fuse in accordance with the embodiments described below. The solid line is designed such that it approximately follows the dashed line (time-current characteristic of the load) with a given offset. The solid line defines a "safe operating area" (SOA) which is indicated by the gray shading in FIG. 8. As can be seen, the SOA can be adapted to a specific load by using a time-current characteristic in the electronic fuse, which corresponds to the solid line (and not to the dash-dotted line as it is implemented in known electronic fuse devices).

As mentioned above, known electronic fuses use a first order filter 42 in the monitoring circuit 4, which entails a current-time characteristic corresponding to the isotherms discussed above (cf. dash-dotted line in FIG. 8). Using a higher order filter as filter 42 in the monitoring circuit 4 (cf. FIG. 6) allows to flexibly adapt the current-time characteristic used by the electronic fuse device (see FIG. 8, solid line) to the current-time characteristic of the load (see FIG. 8, dashed line). The higher the filter order, the better the current-time characteristic used by the electronic fuse device can be adapted to the current-time characteristic of a specific load. The latter can be calculated based on measurements which will be discussed later. Simulations have shown that the time-current characteristics of a wide range of loads can be modeled with sufficient quality using a third order filter.

Figure 9:
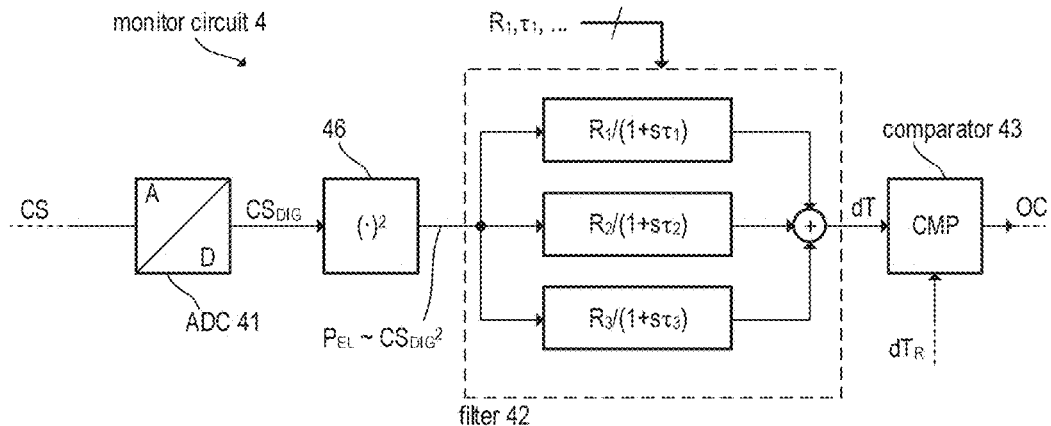
FIG. 9 is one exemplary monitor circuit that may be used in the electronic fuse of FIG. 6 in order to implement an electronic fuse with a time-current characteristic that can be adapted to the time-current characteristic of a load.

FIG. 9 illustrates one exemplary implementation of a monitoring circuit 4 in accordance with the embodiments described herein. Similar to in the example of FIG. 6, the monitor circuit receives the current sense signal CS, which is digitized (digital current sense signal $CS_{DIG}$) and squared (squaring unit 46). It is understood that the squaring unit 46 may be implemented using a digital multiplier. The squared current sense signal $CS_{DIG}^2$ is proportional to the electric power $P_{EL}$ and any heat generation in the load will also be proportional to the electric power $P_{EL}$. The squared current sense signal $CS_{DIG}^2$ is supplied to the filter 42 and the filter output signal dT is supplied to the comparator 43, which is configured to generate the protection signal OC that is indicative of whether or not the filter output signal dT has exceeded the reference value $dT_R$.

If the filter 42 is a first order filter with a transfer function H(s) of the form $H(s)=R_1/(1+s\tau_1)$, the filter output may be interpreted as estimated temperature and the reference value $dT_R$ may be interpreted as temperature associated with an isotherm, as discussed above (see FIG. 8, dash-dotted line). However, in the present example, the filter 42 is a higher order filter with a filter order of two or higher. That is, the filter transfer function in the present example can be written as:

$$H(s)=R_1/(1+s\tau_1)+R_2/(1+s\tau_2)+R_3/(1+s\tau_3). \quad (1)$$

In this example, the filter transfer function H(s) represents a parallel connection of three first order filters with different gains $R_1$, $R_2$, $R_3$ and different time constants $\tau_1$, $\tau_2$, $\tau_3$. It is noted that the filter structure as such is not important and equation above can also be written as:

$$H(s) = \frac{\begin{array}{l}R_1(1+s\tau_2)(1+s\tau_3) + \\ R_2(1+s\tau_1)(1+s\tau_3)R_3(1+s\tau_1)(1+s\tau_2)\end{array}}{(1+s\tau_1)(1+s\tau_2)(1+s\tau_3)}. \quad (2)$$

With a higher order filter 42 it is possible to adapt the time-current characteristic of the electronic fuse 10 to the time-current characteristic of the load. The functionality of the electronic fuse is enhanced (as compared with known electronic fuse circuits), and the time-current characteristic of the electronic fuse does not necessarily imitate a conventional fuse but can be adapted to the characteristics of the load.

Figure 10A:
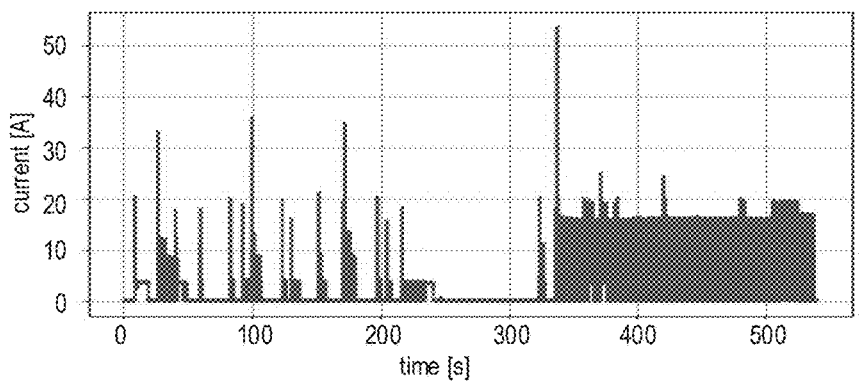

The diagrams of FIGS. 10A-10D illustrate a method for designing/calculating the filter coefficients for a higher order filter 42. The method starts with a measured waveform of the current passing through a load during a normal/typical operation. An exemplary waveform (course of load current over time) is illustrated in FIG. 10A. Based on the waveform of FIG. 10A, diagram a may also be calculated by averaging a plurality of measured waveforms.

Figure 10B:
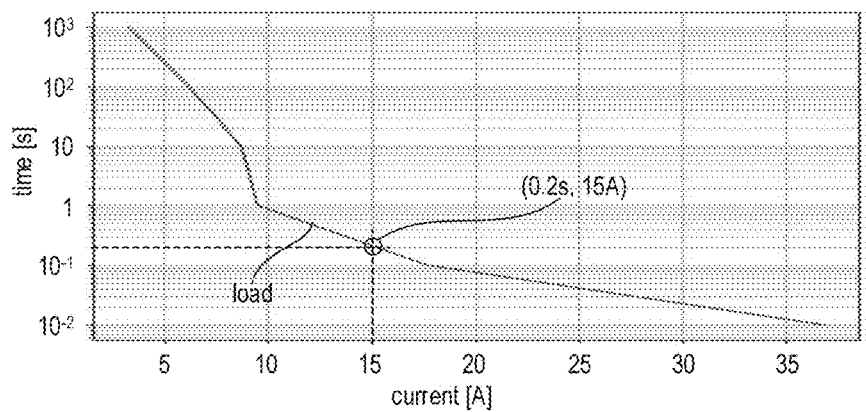

Based on the measured waveform of FIG. 10A, a time-current characteristic may be calculated. One example is depicted in FIG. 10B. As discussed above, the time-current characteristic indicates how long a specific current level flows through the load (and thus also through the electronic fuse connecting the load with the supply). One option for obtaining the time-current characteristic of the load (FIG. 10B) from the measured waveform (FIG. 10A) is to determine a root mean square value (RMS value, also referred to as effective value) for different time intervals (e.g. 0.01) and select the maximum for each time interval. Accordingly, assuming the waveform of FIG. 10A, is denoted as $i_L(t)$ for $t \geq 0$, a point $(i_x, t_x)$ of the time-current characteristic can be calculated as $$i_x = \max\{rms(u)\} = \max\left\{\sqrt{\frac{1}{t_x}\int_u^{u+t_x}i_L(t)^2 dt}\right\}, \quad (3)$$

for a given time $t_x$, wherein u is a time offset and may vary from 0 to $T-t_x$, when $i_L(t)$ is defined (has been measured) in the interval [0, T]. In other words, for the measured current characteristic $i_L(t)$, the RMS value is calculated in a sliding time-window with window length $t_x$, and the maximum RMS value is determined (i.e. the maximum of the RMS values calculated for various temporal positions of the sliding time-window). Equation 3 is evaluated for a plurality of window length $t_x$, e.g. for $10^{-2}$ s, $10^{-1}$ s, 1 s, 10 s, $10^2$ s, and $10^3$ s in the example of FIGS. 10A-10B. The resulting combinations ($i_x$, $t_x$) are illustrated in FIG. 10B, FIG. 10C and FIG. 10D.

As can be seen from FIG. 10B, the calculated time-current characteristic of the load indicates a maximum time for a specific current. According to the depicted example, a current of 15 A (RMS) will occur for 0.2 s maximum. In the next step, a suitable cable is selected. As discussed above, a cable may be represented by an isotherm, which is shown in FIG. 10C. The position of the time-current characteristic of the cable depends on the cable diameter and the allowable temperature difference over ambient temperature (i.e. the allowable thermal load of the cable). Usually, one tries to choose the wire diameter that is as small as possible (which means shifting the time-current characteristics of the cable as close to the time current characteristics of the load as possible) in order to avoid oversizing the cable. One reasonable choice is illustrated in FIG. 10C.

A conventional fuse will have a similar time-current characteristic as the cable. That is, the fuse will blow as soon as a critical time-current combination is reached, e.g. a current of 30 A (RMS) for 1 s. As discussed above, known electronic fuses are designed to emulate the behavior of conventional fuses and disconnect the load from the supply when the above-mentioned critical time-current combination is reached.

As discussed above with reference to FIG. 9, a monitoring circuit 4 with a higher order filter 42 allows the implementation of an enhanced electronic fuse with a time-current characteristic, which has a more complex shape and can be adapted to the time-current characteristic of the load. FIGS. 10A-10D illustrate one example of a time-current characteristic of an enhanced electronic fuse in which a third order filter is employed. As can be seen in FIG. 10D, for a current of, e.g. 30 A (RMS), the enhanced electronic fuse will disconnect the load from the supply after 30 ms, whereas an electronic fuse implemented in a conventional way will wait for 1 second before disconnecting the load. As the time-current characteristic of the enhanced electronic fuse is adapted to the time-current characteristic of a specific load, a malfunction of the load causing an unusually high current that is, nevertheless, too low to trigger a conventional fuse can be detected early.

Figure 11:
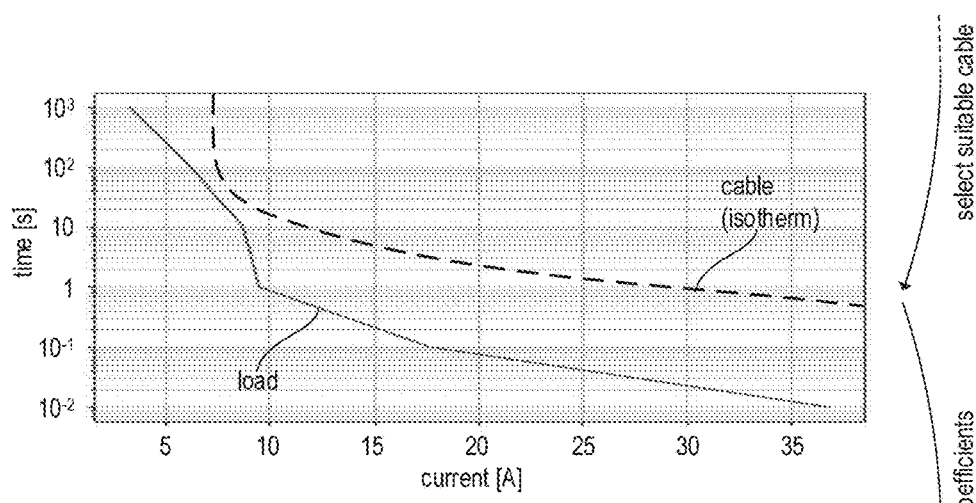
FIG. 11 illustrates a further example of an enhanced electronic fuse circuit that has a digital communication interface.
Figure 11:
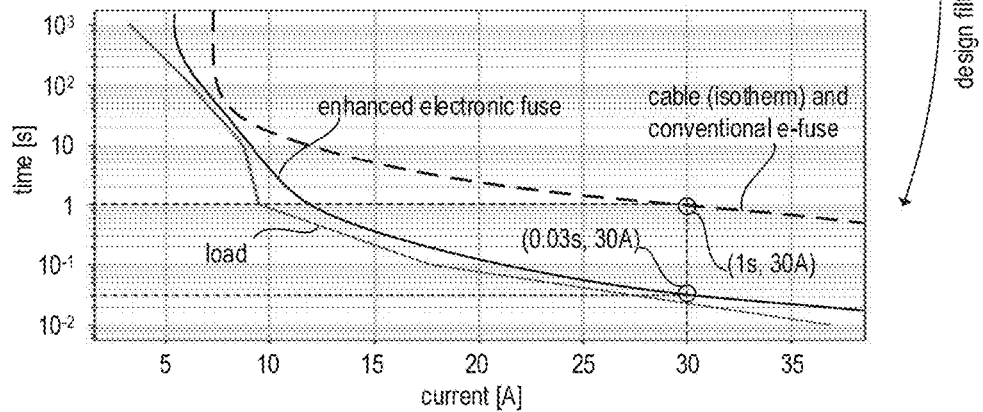
Figure 11:
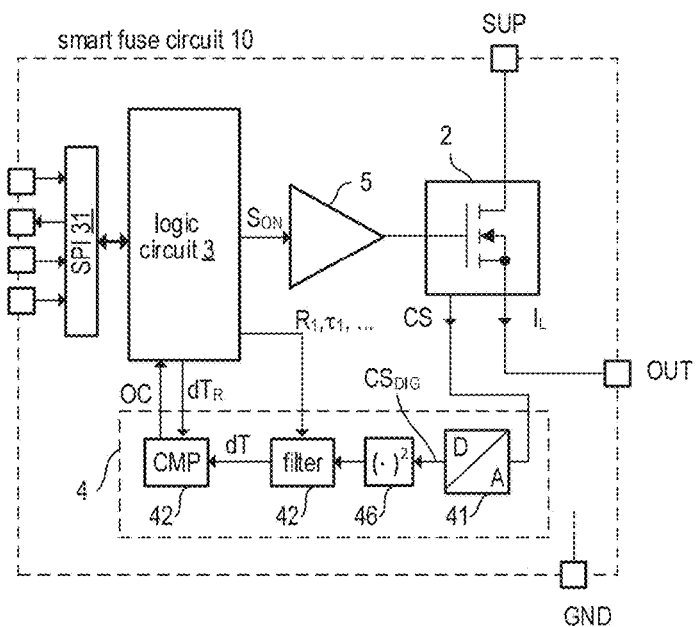

Some aspects of the embodiments described herein are summarized below with reference to FIG. 11, which illustrates an example of an electronic fuse device similar to the embodiment of FIG. 6 but with a digital communication interface 31 such as a Serial Peripheral Interface (SPI) or the like. Generally, an electronic fuse circuit in accordance with the embodiments described herein is an integrated circuit including a power transistor 2 coupled between a supply pin SUP and an output pin OUT of the integrated circuit. The output pin OUT can be connected to and disconnected from the supply pin SUP by switching the power transistor 2 on and off. The integrated circuit further includes a current sensing circuit coupled to the power transistor 2 and configured to generate a current sense signal CS that is indicative of a load current $i_L$ passing through the power transistor 2. The current sense circuit may include a sense transistor coupled to the power transistor and providing a sense current as a current sense signal that is substantially proportional to the load current $i_L$. Current sense circuits using a sense transistor coupled to the power transistor are well known in the field of semiconductor technology (e.g. from US20020024376A1) and thus not further discussed herein. The integrated circuit further includes a monitor circuit 4 (see also FIG. 9) that is configured to receive the current sense signal CS and to provide a protection signal OC based on the current sense signal CS and a threshold value $dT_R$. The monitor circuit 4 includes a filter 42 that is configured to receive a filter input signal that depends on the current sense signal CS (e.g. the filter input signal is proportional to the squared current sense signal) and which has a transfer characteristic with two or more time constants $\tau_1, \tau_2, \tau_3$.

In accordance with one embodiment, the two or more time constants $\tau_1, \tau_2, \tau_3$ represent a low pass filter of second or higher order. The constants $\tau_1, \tau_2, \tau_3$ define respective poles of the filter. The filter of order two or higher may be implemented by coupling two or more first order filters in parallel, wherein each first order filter is characterized by a time constant and a gain (see FIG. 9, gains $R_1, R_2, R_3$). The gains may be configurable like the time constants. For this purpose, the integrated circuit may include a communication interface 31 that allows receiving configuration data (e.g. time constants s $\tau_1, \tau_2, \tau_3$ and gains $R_1, R_2, R_3$) across, e.g., a serial bus. The communication interface 31 also allows to receive switch-on and switch-off commands from an external controller (see FIG. 1, microcontroller 8), in response to which the control logic 3 triggers a switch-on or switch-off. A switch-off may also be triggered when the protection signal OC indicates that the load current has reached a critical time-current combination defined by the time-current characteristic implemented in the integrated circuit (and defined by the time constants and gains of filter 42). Alternatively to receiving switch-on and switch-off commands over a digital communication link, a level transition of a binary input signal (such as the input signal $S_{IN}$ in the example of FIG. 7) may be regarded as switch-on command (e.g. a transition from a low level to a high level) or a switch-off command (e.g. a transition from a high level to a low level).

It is understood that, although a digital implementation of the monitoring circuit 4 and particularly of the filter 42 may have some advantages, an analog implementation is, nevertheless, also possible and may be preferred in some applications.

Although the invention has been illustrated and described with respect to one or more implementations, alterations and/or modifications may be made to the illustrated examples without departing from the spirit and scope of the appended claims. For example, the logic levels used to trigger a specific action may be inverted as compared to the depicted examples. Logic gates may be replaced by other logic circuits that perform substantially the same function, etc. In particular regard to the various functions performed by the above described components or structures (units, assemblies, devices, circuits, systems, etc.), the terms used to describe such components are intended to correspond—unless otherwise indicated—to any component or structure, which performs the specified function of the described component (e.g., that is functionally equivalent), even though not structurally equivalent to the disclosed structure, which performs the function in the herein illustrated exemplary implementations of the invention.

The invention claimed is:

1. An integrated circuit comprising:
    a power transistor coupled between a supply pin and an output pin;

a current sensing circuit coupled to the power transistor and configured to generate a current sense signal indicative of a load current passing through the power transistor; and a monitor circuit configured to receive the current sense signal and to provide a protection signal based on the current sense signal and a threshold value;

wherein the monitor circuit includes a filter which is configured to receive a filter input signal that depends on the current sense signal, the filter having a transfer characteristic with two or more time constants, wherein the two or more time constants are dependent on time-current characteristics of a load and the time-current characteristics are defined based on a measured waveform representing the load current passing through the load over time.

2. The integrated circuit of claim 1,
wherein the two or more time constants represent low-pass filters of order two or higher.

3. The integrated circuit of claim 1,
wherein the two or more time constants represent two or more respective poles of a low-pass filter.

4. The integrated circuit of claim 1,
wherein the two or more time constants represent two or more respective first order low-pass filters connected in parallel.

5. The integrated circuit of claim 1,
wherein the filter has a configurable gain.

6. The integrated circuit of claim 1, further comprising:
a logic circuit configured to trigger a switch-off of the power transistor or signal an error in response to the protection signal.

7. The integrated circuit of claim 6, wherein the logic circuit is configured to receive a switch-on command and to trigger a switch-on of the power transistor in response to the switch-on command.

8. The integrated circuit of claim 7, wherein the switch-on command is represented by a level transition of a binary input signal.

9. The integrated circuit of claim 1, wherein the filter input signal represents a non-linear function of the current sense signal.

10. The integrated circuit of claim 1, wherein the monitor circuit further comprises:
a comparator configured to receive an output signal of the filter and the threshold value and to provide the protection signal based on the output signal of the filter and the threshold value.

11. The integrated circuit of claim 1, wherein the monitor circuit further comprises:
an analog-to-digital converter configured to digitize the current sense signal.

12. The integrated circuit of claim 11,
wherein the analog-to-digital converter has a piece-wise linear characteristic and the filter receives the digital current sense signal as input signal.

13. The integrated circuit of claim 11,
wherein the analog-to-digital converter has a linear characteristic and the filter receives a signal that represents a non-linear function of the digital current sense signal as input signal.

14. The integrated circuit of claim 9,
wherein the non-linear function is a square function.

15. A method comprising:
enabling a load current path from a supply pin and an output pin by switching-on a power transistor;
providing a signal representing the load current passing through the power transistor; and
generating a protection signal based on the current sense signal and a threshold value;
wherein generating the protection signal includes filtering a filter input signal that is dependent on the load current signal using a filter that has a transfer characteristic with two or more time constants, wherein the two or more time constants are dependent on time-current characteristics of a load and the time-current characteristics are defined based on a measured waveform representing the load current passing through the load over time.

16. The method of claim 15, further comprising:
triggering a switch-off of the power transistor or signaling an error in response to the protection signal.

17. The method of claim 15,
wherein the filter input signal is indicative of a non-linear function of the load current.

18. The method of claim 15, wherein generating the protection signal further includes:
comparing the output signal of the filter and the threshold value, the protection signal being indicative of whether the output signal of the filter has exceeded the threshold value.

19. A method comprising:
providing a measured waveform representing the load current passing through a load over time;
calculating a time-current characteristics of the load based on the measured waveform;
calculating two or more time constants dependent on the time-current characteristics of the load; and
using the calculated time constants into an integrated circuit comprising:
a power transistor coupled between a supply pin and an output pin;
a current sensing circuit coupled to the power transistor and configured to generate a current sense signal indicative of a load current passing through the power transistor; and
a monitor circuit configured to receive the current sense signal and to provide a protection signal based on the current sense signal and a threshold value,
wherein the monitor circuit includes a filter which is configured to receive a filter input signal that depends on the current sense signal, the filter having a transfer characteristic with the two or more time constants.

20. The method of claim 19,
wherein the time-current characteristic of the load represents the maximum RMS value of the load current throughout a given period of time.

21. The method of claim 20,
wherein the time constants are programmed into the integrated circuit using a digital communication interface of the integrated circuit.

* * * * *